(12) United States Patent
Choi et al.

(10) Patent No.: US 11,257,976 B2
(45) Date of Patent: Feb. 22, 2022

(54) SEMICONDUCTOR DEVICES AND METHODS OF MANUFACTURING SEMICONDUCTOR DEVICES

(71) Applicant: Amkor Technology Singapore Holding Pte. Ltd., Singapore (SG)

(72) Inventors: Wook Choi, Gyeonggi-do (KR); Dong Gun Lee, Incheon (KR); Jong Dae Jung, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 185 days.

(21) Appl. No.: 16/596,566

(22) Filed: Oct. 8, 2019

(65) Prior Publication Data
US 2021/0104642 A1  Apr. 8, 2021

(51) Int. Cl.
| | |
|---|---|
| *H01L 31/12* | (2006.01) |
| *G02B 7/02* | (2021.01) |
| *H01L 31/0232* | (2014.01) |
| *H01L 31/0203* | (2014.01) |
| *G02B 3/00* | (2006.01) |

(52) U.S. Cl.
CPC ............ *H01L 31/12* (2013.01); *G02B 3/0037* (2013.01); *G02B 7/021* (2013.01); *H01L 31/0203* (2013.01); *H01L 31/02327* (2013.01)

(58) Field of Classification Search
CPC ............... H01L 31/12; H01L 31/0203; H01L 31/02327
USPC ........................................................ 257/83
See application file for complete search history.

(56) References Cited

U.S. PATENT DOCUMENTS

2012/0243237 A1* 9/2012 Toda .................. F21V 19/0035
362/306

* cited by examiner

*Primary Examiner* — Elias Ullah
(74) *Attorney, Agent, or Firm* — Spectrum IP Law Group LLC

(57) ABSTRACT

In one example, a semiconductor device comprises a substrate, an optical device on a top side of the substrate, a translucent cover over the optical device, wherein the translucent cover is a unitary monolithic piece comprising a cover base and a cover pipe. and a cover structure on the top side of the substrate to support the translucent cover over the optical device. Some examples and related methods are also disclosed herein.

20 Claims, 12 Drawing Sheets

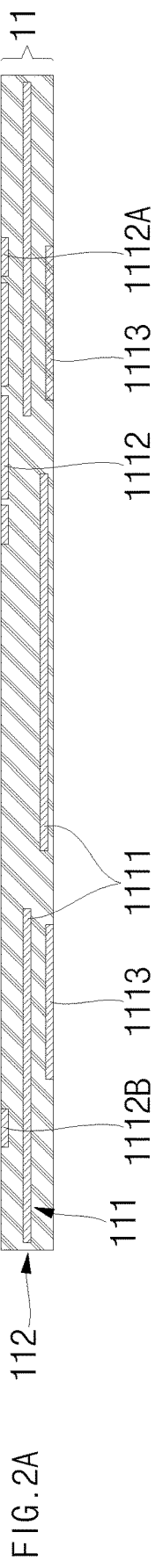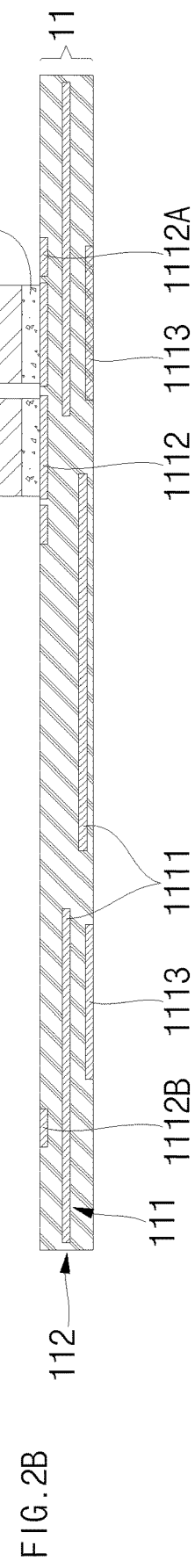

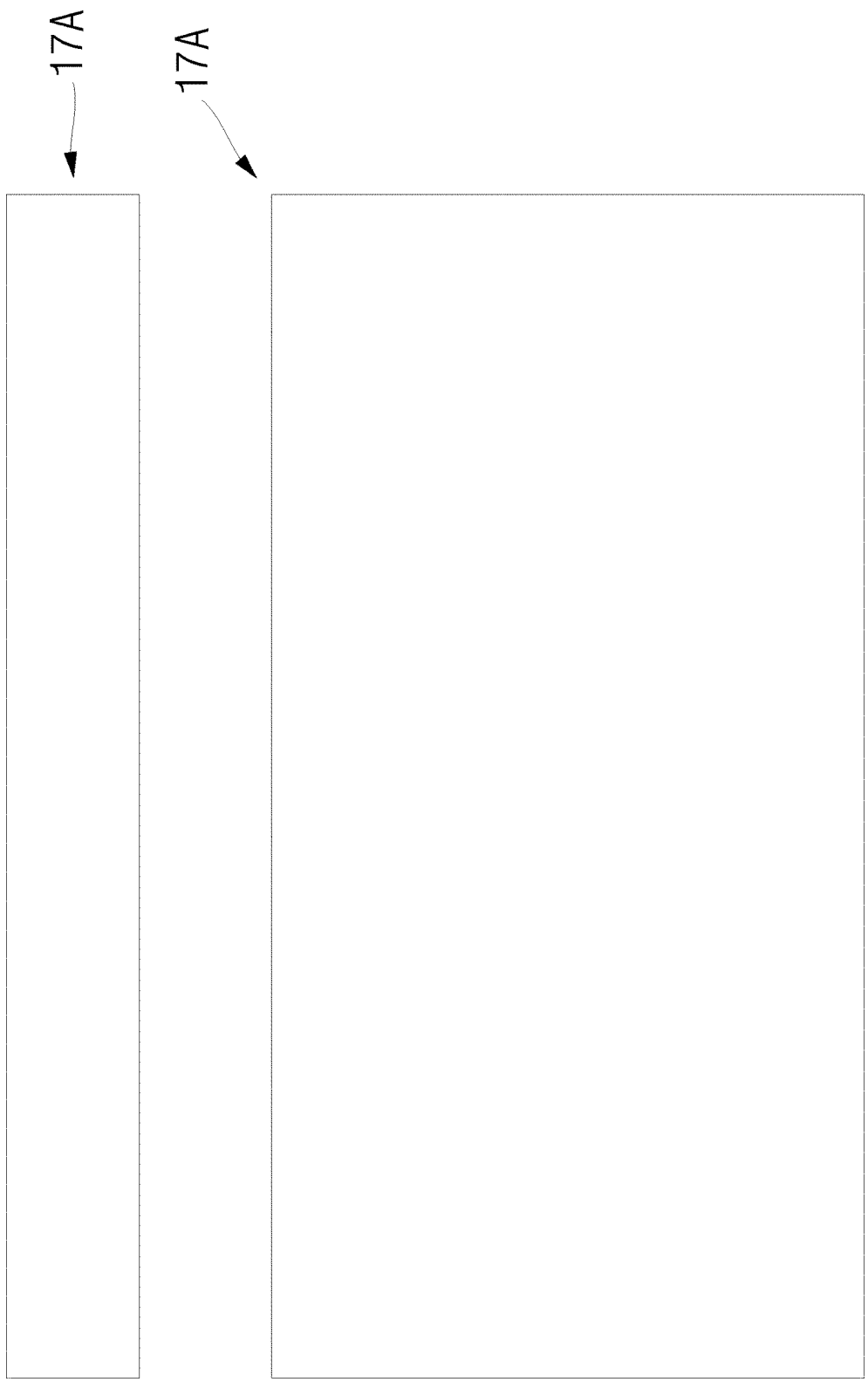

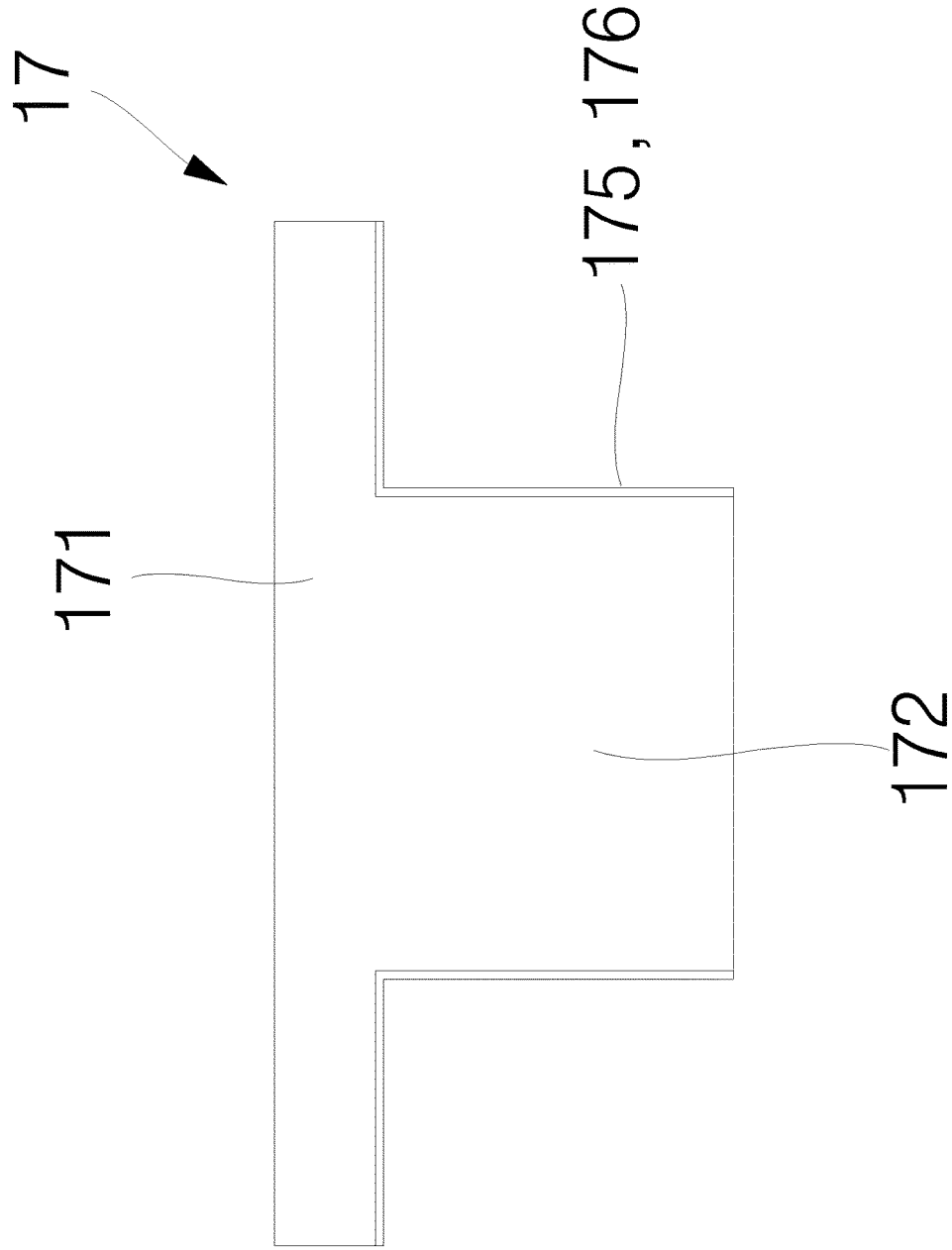

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A to 2G show cross-sectional views of an example method for manufacturing an example semiconductor device.

FIGS. 4A to 4C show cross-sectional views and plan views of an example method for manufacturing a translucent cover for an example semiconductor device.

FIG. 5 shows a cross-sectional view of an example translucent cover for an example semiconductor device.

Figure 1:
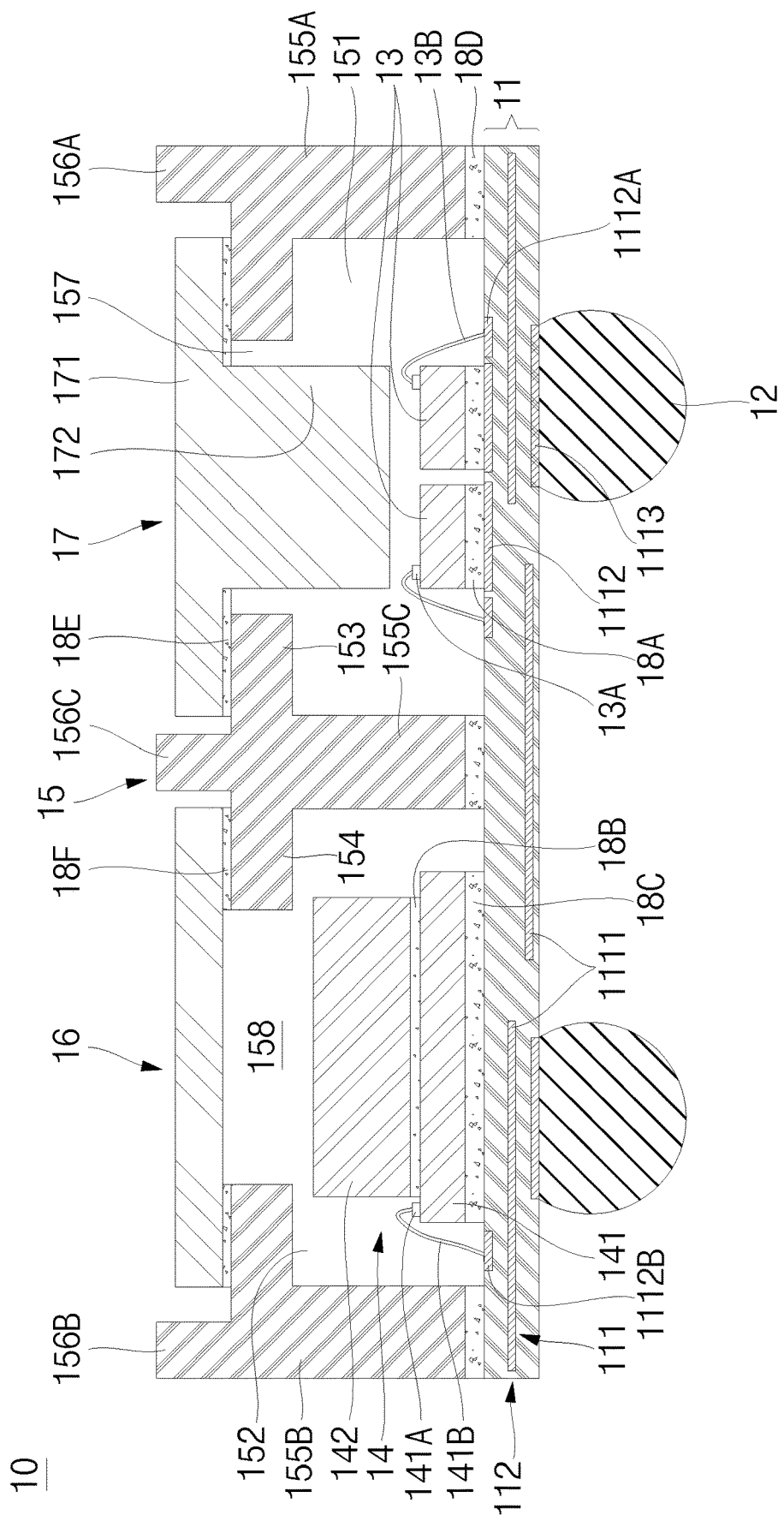
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. For example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, a semiconductor device, comprises a substrate, an optical device on a top side of the substrate, a translucent cover over the optical device, wherein the translucent cover is a unitary monolithic piece comprising a cover base and a cover pipe, and a cover structure on the top side of the substrate to support the translucent cover over the optical device.

In another example, a method to manufacture a semiconductor device comprises providing a substrate, providing an optical device on a top side of the substrate, providing a translucent cover attached to a cover structure, wherein the translucent cover is a unitary monolithic piece comprising a cover base and a cover pipe, and attaching the cover structure to the top side of the substrate to cover the optical device with the translucent cover.

In a further example, a method to manufacture a translucent cover, comprises providing a translucent cover plate, providing trenches in the cover plate to provide an island defining a cover pipe, and cutting along center lines of the trenches to define a cover base connected to the cover pipe as a unitary monolithic piece.

Some examples are included in the present disclosure. Such examples may be found in the figures, in the claims, or in the description of the present disclosure.

FIG. 1 shows a cross-sectional view of an example semiconductor device 10. In the example shown in FIG. 1, semiconductor device 10 can comprise substrate 11, optical devices 13 and 14, internal interconnects 13B and 141B, cover structure 15, translucent covers 16 and 17, and adhesives 18A, 18B, 18C, 18D, 18E and 18F. In some examples, semiconductor device 10 can further comprise external interconnects 12.

Substrate 11 can comprise conductive structure 111 and dielectric structure 112. Conductive structure 111 can comprise conductive patterns 1111, top interconnects 1112, 1112A and 1112B, and base interconnects 1113. Optical devices 13 and 14 can comprise terminals 13A and 141A, respectively. Optical device 14 can comprise electronic device 141 and lens structure 142. Cover structure 15 can comprise compartments 151 and 152, supports 155A, 155B and 155C, ledges 153 and 154, and protrusions 156A, 156B and 156C. Translucent cover 17 can comprise cover base 171 and cover pipe 172.

Substrate 11, cover structure 15 and translucent covers 16 and 17 can be referred to as a semiconductor package, which can protect optical devices 13 and 14 and internal interconnects 13B and 141B from external elements or environmental exposure. In some examples, semiconductor package can provide electrical coupling to external devices via external interconnects 12.

In some examples, semiconductor device 10 can include substrate 11, and optical device 13 on a top side of substrate 11. Optical device 13 in some examples can comprise a plurality of optical devices. Translucent cover 17 can be over optical device 13 and can comprise cover base 171 and cover pipe 172. Cover structure 15 can be on the top side of substrate 11 to support translucent cover 17 over optical device 13. Translucent cover 17 can be attached to cover structure 15 via adhesive 18E. For example, adhesive 18E can attach translucent cover 17 to ledge 153 of cover structure 15.

In some examples, cover structure 15 comprises first support portion such as support 155A and second support portion such as support 155C to define compartment 151, wherein optical device 13 is in compartment 151. In other examples, cover structure 15 comprises a first support portion such as support 155B a second support portion such as support 155C, and a third support portion such as support 155A, and optical device 13 is between the second support portion and the third support portion. An additional optical device such as electronic device 141 can be on the top side of substrate 11 between the first support portion such as support 155B and the second support portion such as support 155C. In addition, a lens structure 142 can be on a top side of the additional optical device such as electronic device 141. An additional translucent cover 16 can be over the additional optical device and can be attached to the first support and the second support portion, for example via adhesive 18F on ledge 154 of support 155C. The support portions of cover structure 15 can comprise protrusion 156A, protrusion 156B, and protrusion 156C. Protrusion 156C can be between optical device 13 and the additional optical device such as electronic device 141. Protrusion 156C can extend higher than a top side of either translucent cover 16 or translucent cover 17, or both.

Figure 2C:
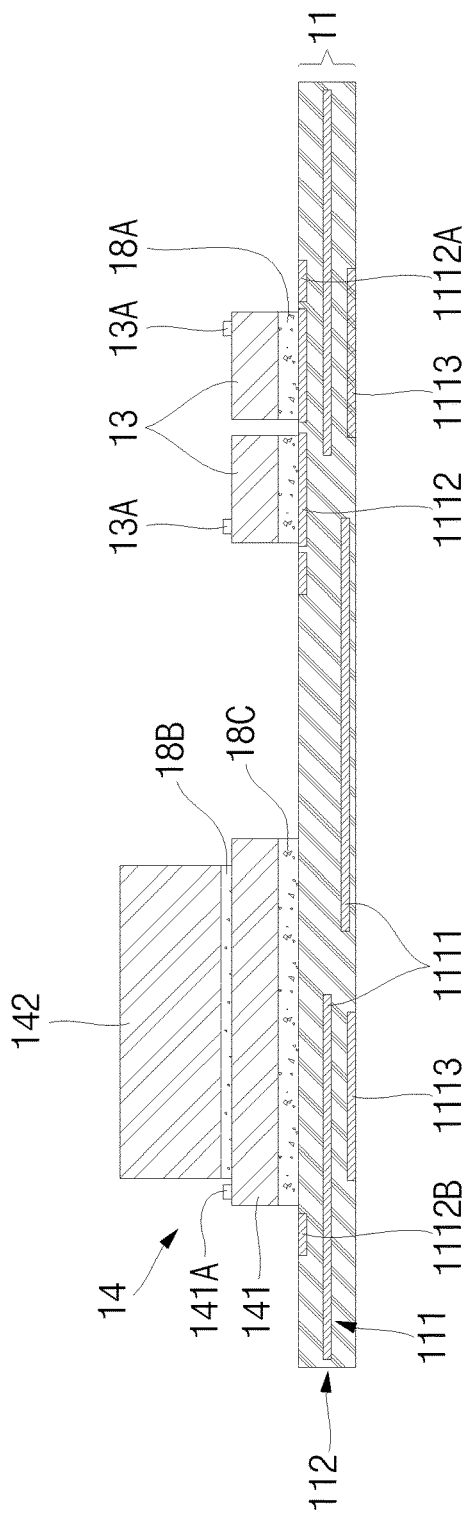

FIGS. 2A to 2G show cross-sectional views of an example method for manufacturing semiconductor device 10. FIG. 2A shows a cross-sectional view of semiconductor device 10 at an early stage of manufacture.

In the example shown in FIG. 2A, a method to manufacture semiconductor device 10 can include providing substrate 11. Substrate 11 can comprise conductive structure 111 and dielectric structure 112. In some examples, substrate 11 can be referred to as or can comprise a laminate substrate, a ceramic substrate, or coreless substrate. Substrate 11 can have a thickness in the range from approximately 0.3 mm to approximately 0.4 mm. Substrate 11 can support or interconnect optical devices 13, 14, and cover structure 15. Substrate 11 can electrically interconnect optical devices 13 and 14 to external devices or structures. Conductive structure 111 can comprise one or more conductive layers. Conductive structure 111 can comprise conductive patterns 1111 positioned in or interleaved with dielectric structure 112, top interconnects 1112, 1112A and 1112B positioned at a top side of substrate 11, and base interconnects 1113 positioned at a bottom side of substrate 11. In some examples, conductive patterns 1111, top interconnects 1112, 1112A and 1112B and base interconnects 1113 can be electrically coupled to one another. Conductive patterns 1111 can be referred to as or can comprise traces, vias or signal redistribution paths. Top interconnects 1112, 1112A and 1112B can be referred to as or can comprise bond fingers, pads, lands, Under Bump Metallizations (UBMs), pillars, or posts. Base interconnects 1113 can also be referred to as or can also comprise pads, lands, UBMs, pillars, or posts. In some examples, conductive patterns 1111, top interconnects 1112, 1112A and 1112B or base interconnects 1113 can have a thickness in the range from approximately 0.1 mm to approximately 0.2 mm. Dielectric structure 112 can comprise one or more dielectric layers interleaved with the conductive layers of conductive structure 111. In some examples, dielectric structure 112 can have a thickness in the range from approximately 0.1 mm to approximately 0.2 mm.

In some examples, substrate 11 can be a pre-formed substrate. The pre-formed substrate can be manufactured prior to attachment to electronic devices or components and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or glass-reinforced epoxy laminate material (FR4), and dielectric and conductive layers can be formed on the permanent core structure. In some examples, the pre-formed substrate can be a coreless substrate which omits the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrate can be formed through a semi-additive or modified-semi-additive process.

In some examples, substrate 11 can be a redistribution layer (RDL) substrate. RDL substrates can comprise one or more conductive redistribution layers and one or more dielectric layers that (a) can be formed layer by layer over an optical device to which the RDL substrate is to be electrically coupled, or (b) can be formed layer by layer over a carrier that can be entirely removed or at least partially removed after the optical device and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed in an additive buildup process that can include one or more dielectric layers alternatingly stacked with one or more conductive layers that define respective conductive redistribution patterns or traces configured to collectively (a) fan-out electrical traces outside the footprint of the electronic device, or (b) fan-in electrical traces within the footprint of the electronic device. The conductive patterns can be formed using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process, which can include a photolithographic mask through which light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride (Si3N4), silicon oxide (SiO2), or silicon oxynitride (SiON). The inorganic dielectric layer(s) can be formed by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can be referred to as a coreless substrate.

FIG. 2B shows a cross-sectional view of semiconductor device 10 at a later stage of manufacture. In the example shown in FIG. 2B, a method to manufacture semiconductor device 10 can include providing an optical device 14 on a top side of substrate 11. Optical devices 13 can be coupled to the top side of substrate 11 using adhesive 18A. In some examples, adhesive 18A can be referred to as or can comprise a thermally or electrically conductive adhesive. In some examples, adhesive 18A can electrically couple optical devices to top interconnects 1112 provided on top of substrate 11. In some examples, optical devices 13 can be referred to as or can comprise light emitting diodes (LEDs), micro-electro-mechanical systems (MEMS), or optical sensors. Optical devices 13 can have a thickness in the range from approximately 0.1 millimeters (mm) to approximately 0.5 mm. In some examples, optical devices 13 can emit light through translucent cover 17, such as for performing optical communication. While two optical devices 13 are illustrated in FIG. 2B, less than or more than two optical devices 13 can be provided.

FIG. 2C shows a cross-sectional view of semiconductor device 10 at a later stage of manufacture. In the example shown in FIG. 2C, optical device 14 can be coupled to substrate 11. Optical device 14 can comprise electronic device 141 and lens structure 142. Electronic device 141 can be referred to as or can comprise a chip, an integrated circuit, a packaged device, an optical sensor, or optical sensor circuitry for processing inbound or outbound optical signals. Lens structure 142 can be referred to as or can comprise one or more lenses, or a micro-lens array (MLA). Electronic device 141 and lens structure 142 can be adhered to each other through adhesive 18B, which can be translucent. Electronic device 141 can be coupled to top side of substrate 11 through adhesive 18C. Electronic device 141 can have a thickness in the range from approximately 0.3 mm to approximately 0.5 mm. In some examples, lens structure 142 can have a thickness in the range from approximately 0.4 mm to approximately 0.6 mm. In some examples, lens structure 142 can transmit or receive light, such as a light signal through translucent cover 16 for performing optical communication. In some examples, electronic device 141 can receive or emit signals corresponding to light incident on or transmitted from lens structure 142, and can process such signals for communication purposes. In some examples, optical device 13 is configured to transmit a signal through translucent cover 17, and optical device 14 is configured to receive the optical signal, for example via reflection of the signal off an object back to optical device 14, or to receive another optical signal, through translucent cover 16. In some examples, electronic device 141 can comprise application specific integrated circuits, digital signal processors, logic dies, wireless baseband system on chip processors, application processors, radio-frequency (RF) circuits, Wi-Fi circuits, wireless local area network (LAN) circuits, Bluetooth circuits, modems, network processors, memories, power management units, or audio processors. Although only one optical device 14 is illustrated in FIG. 2C, more than one optical device 14 can be provided.

In some examples, the step shown in FIG. 2C (an attachment process of optical device 14) can be first performed and the step shown in FIG. 2B (an attachment process of optical devices 13) can be then performed, or vice-versa. In some examples, the steps shown in FIGS. 2B and 2C can be simultaneously performed.

Figure 2D:
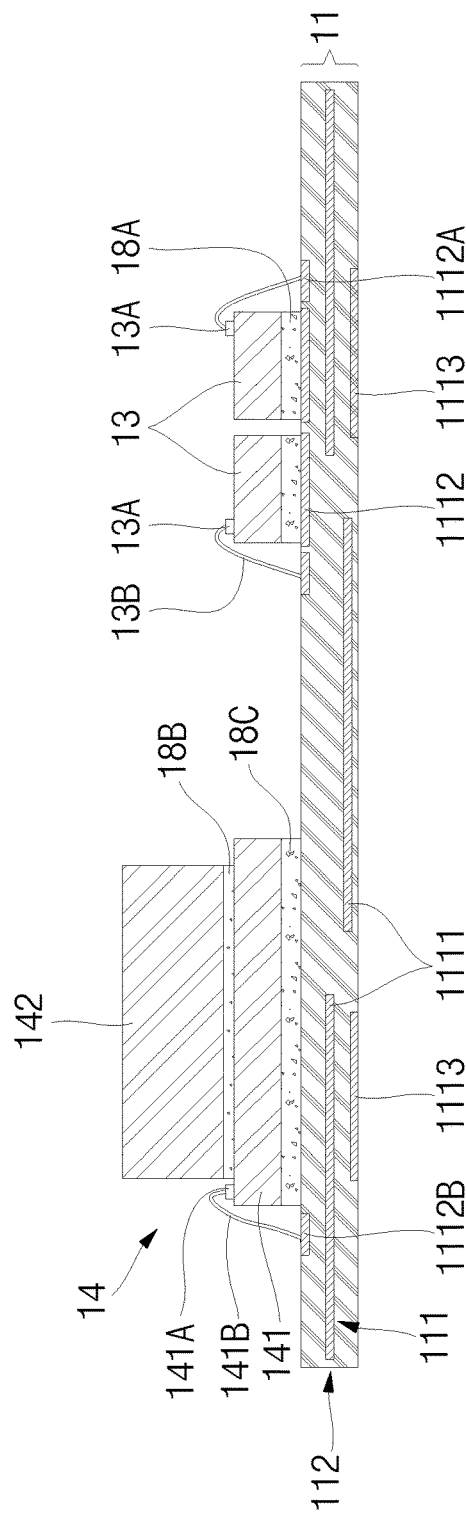

FIG. 2D shows a cross-sectional view of semiconductor device 10 at a later stage of manufacture. In examples shown in FIG. 2D, optical devices 13 and 14 can be electrically coupled to substrate 11. In some examples, terminals 13A of optical devices 13 can be electrically coupled to top interconnects 1112A of substrate 11 by internal interconnects 13B, and terminal 141A of electronic device 141 of optical device 14 can be electrically coupled to top interconnects 1112B of substrate 11 by internal interconnects 141B. In some examples, lens structure 142 can be electrically coupled to substrate 11 or to electronic device 141 by an interconnect similar to internal interconnect 141B. In some examples, internal interconnects 13B and 141B can be referred to as or can comprise gold bonding wires, aluminum bonding wires, copper bonding wires, aluminum bonding wires coated with gold, or palladium bonding wires. Internal interconnects 13B and 141B can have a diameter in the range from approximately 0.01 mm to approximately 0.05 mm. In some examples, internal interconnects 13B and 141B can be microbumps rather than wires. In some examples, optical devices 13 or electronic device 141 can be electrically coupled to top interconnects 1112A and 1112B of substrate 11 in an inverted configuration, like a flip chip. In some examples, terminal 141A can be on a top side of electronic device 141 where the top side of the electronic device 141 is uncovered by lens structure 142.

Figure 2E:
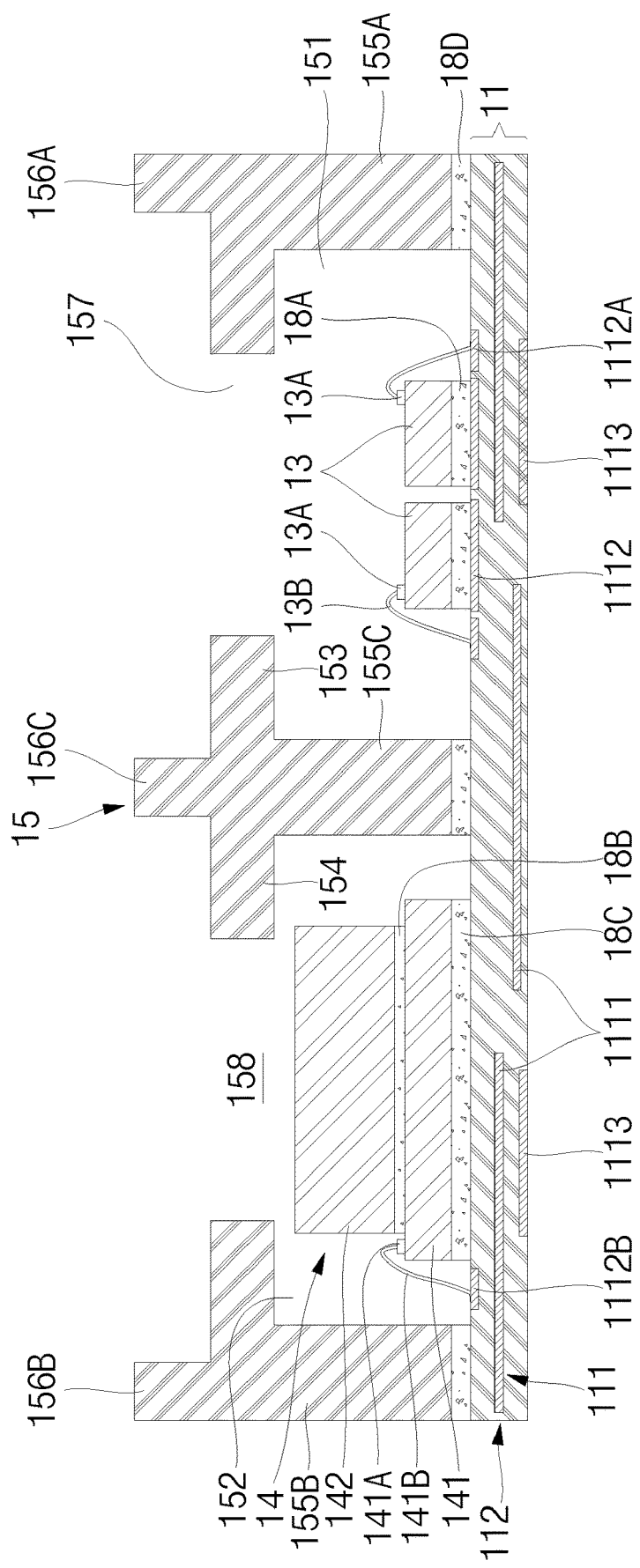

FIG. 2E shows a cross-sectional view of semiconductor device 10 at a later stage of manufacture. In examples shown in FIG. 2E, a method to manufacture semiconductor device 10 can include providing a cover structure 15 that can be adhered to substrate 11 through adhesive 18D. Cover structure 15 can comprise supports 155A, 155B and 155C, ledges 153 and 154, and protrusions 156A, 156B and 156C. Compartment 151 can be formed by supports 155A and 155C, ledges 153, and protrusions 156A and 156C formed around optical devices 13. Compartment 152 can be formed by supports 155B and 155C, ledges 154, and protrusions 156B and 156C formed around optical device 14. In some examples, protrusions 156A, 156B, or 156C can be optional. In some examples, ledges 153 or 153 can be optional, or can comprise a portion of the top side of supports 155A, 155B, or 155C. In some examples, bottom ends of supports 155A, 155B, or 155C can be adhered to top side of substrate 11 through adhesive 18D. Ledges 153 and 154 can extend horizontally from supports 155A, 155B, or 155C positioned higher than optical devices 13 and 14 to interior portions of compartments 151 and 152. Openings 157 and 158 can be formed in ledges 153 and 154, respectively, so that optical devices 13 or 14 can transmit, receive, or process signals to or from each other, or to or from external devices. In some examples, protrusions 156A, 156B, or 156C can extend vertically and upwardly from supports 155A, 155B, or 155C, above ledges 153 and 154. Cover structure 15 can be referred to as, or can comprise, a lid, a housing, a case, or a body. In some examples, cover structure 15 can comprise a plastic, ceramic, metal, or laminate structure. In some examples, cover structure 15 can have a height in the range from approximately 2 mm to approximately 2.5 mm. In some examples, ledges 153 and 154 can have a thickness in the range from approximately 0.4 mm to approximately 0.6 mm. In some examples, protrusions 156A, 156B, or 156C can have a height in the range from approximately 0.1 mm to approximately 0.5 mm. Such cover structure 15 can protect optical devices 13 and 14 and internal interconnects 13B and 141B, which are positioned within compartments 151 and 152, from external environments, and can allow translucent covers 16 and 17 to be mounted on cover structure 15.

Figure 2F:
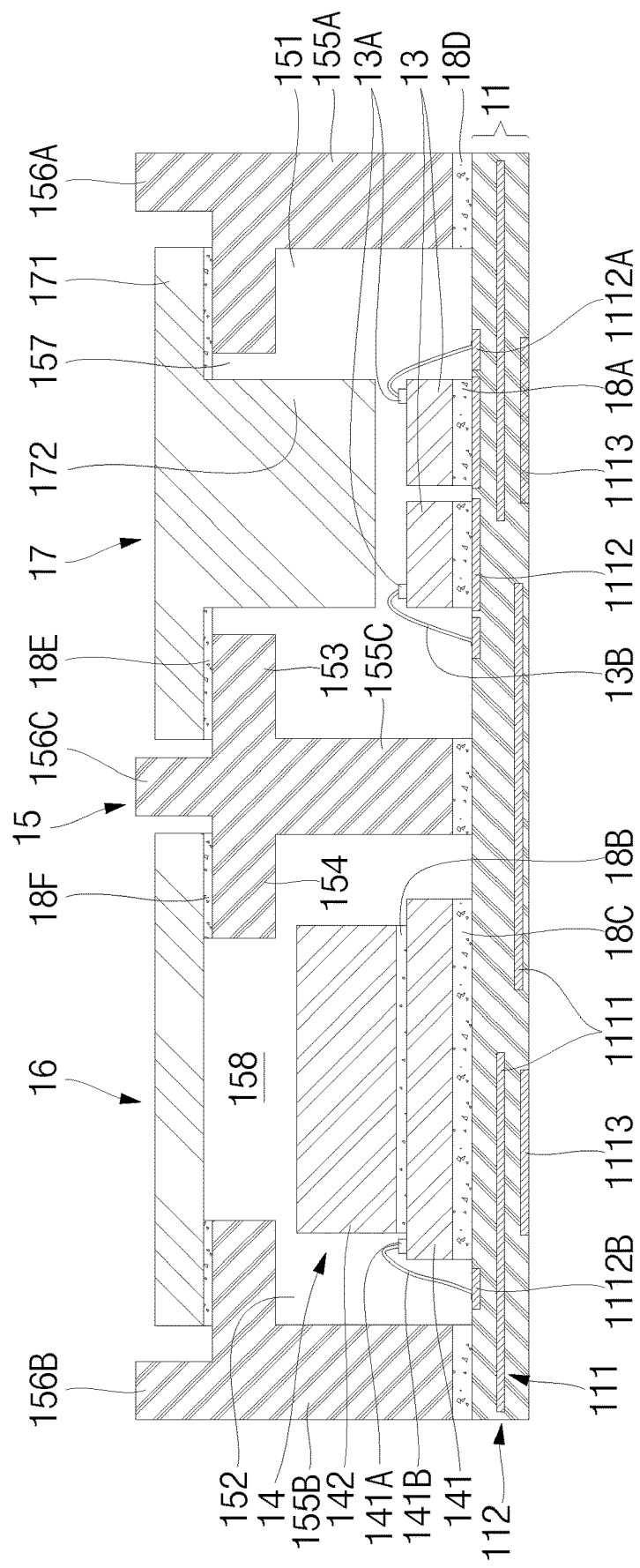

FIG. 2F shows a cross-sectional view of semiconductor device 10 at a later stage of manufacture. In examples shown in FIG. 2F, translucent covers 16 and 17 can be provided and mounted on cover structure 15. In some examples, translucent cover 17 can comprise cover base 171 having a width greater than a width of cover pipe 172. In some examples, cover base 171 can be thicker than cover pipe 172, or vice-versa. In some examples, a bottom side of cover base 171 can be adhered to a top side of ledge 153 through adhesive 18E. In some examples, cover pipe 172 can pass through opening 157 of ledge 153 to extend from cover base 171 towards upper portions of optical devices 13. In some examples, ledges 153 can define an aperture in compartment 151, and cover pipe 172 can extend through the aperture towards optical device 13. In some examples, cover pipe 172 can extend through a majority of a height of compartment 151 toward optical device 13. In some examples, cover base 171 can be at least partially exposed through the aperture. Translucent cover 17 is shown comprising cover base 171 and cover pipe 172 as a single integral piece such as a unitary or monolithic piece, but there can be embodiments where cover base 171 and cover pipe 172 can comprise separate pieces coupled together. Translucent cover 17 can have a thickness in the range from approximately 0.6 mm to approximately 0.8 mm. Translucent cover 17 can be positioned such that cover pipe 172 is adjacent to optical devices 13 to facilitate outbound or inbound transmission of light signals from or to optical devices 13 while minimizing loss. In some examples, a height of cover pipe 172 is at least twice a height of cover base 171.

In some examples, translucent cover 16 can be adhered to cover structure 15 through adhesive 18F. In some examples, translucent cover 16 can be adhered to top side of ledge 154 through adhesive 18F. Accordingly, opening 158 formed in ledge 154 can be covered by translucent cover 16. Translucent cover 16 can have a thickness in the range from approximately 0.1 mm to approximately 0.3 mm. As described above, an external light signal can be transmitted to or from optical device 14 through translucent cover 16. In some examples, translucent cover 16 can also be similar to translucent cover 17, with a cover base 171 and cover pipe 172. Although translucent covers 16 and 17 are shown as separate pieces, there can be examples where translucent covers 16 and 17 can be a single piece, sharing a common cover base 171 that extends over compartments 151 and 152, without protrusion 156C.

Figure 2G:
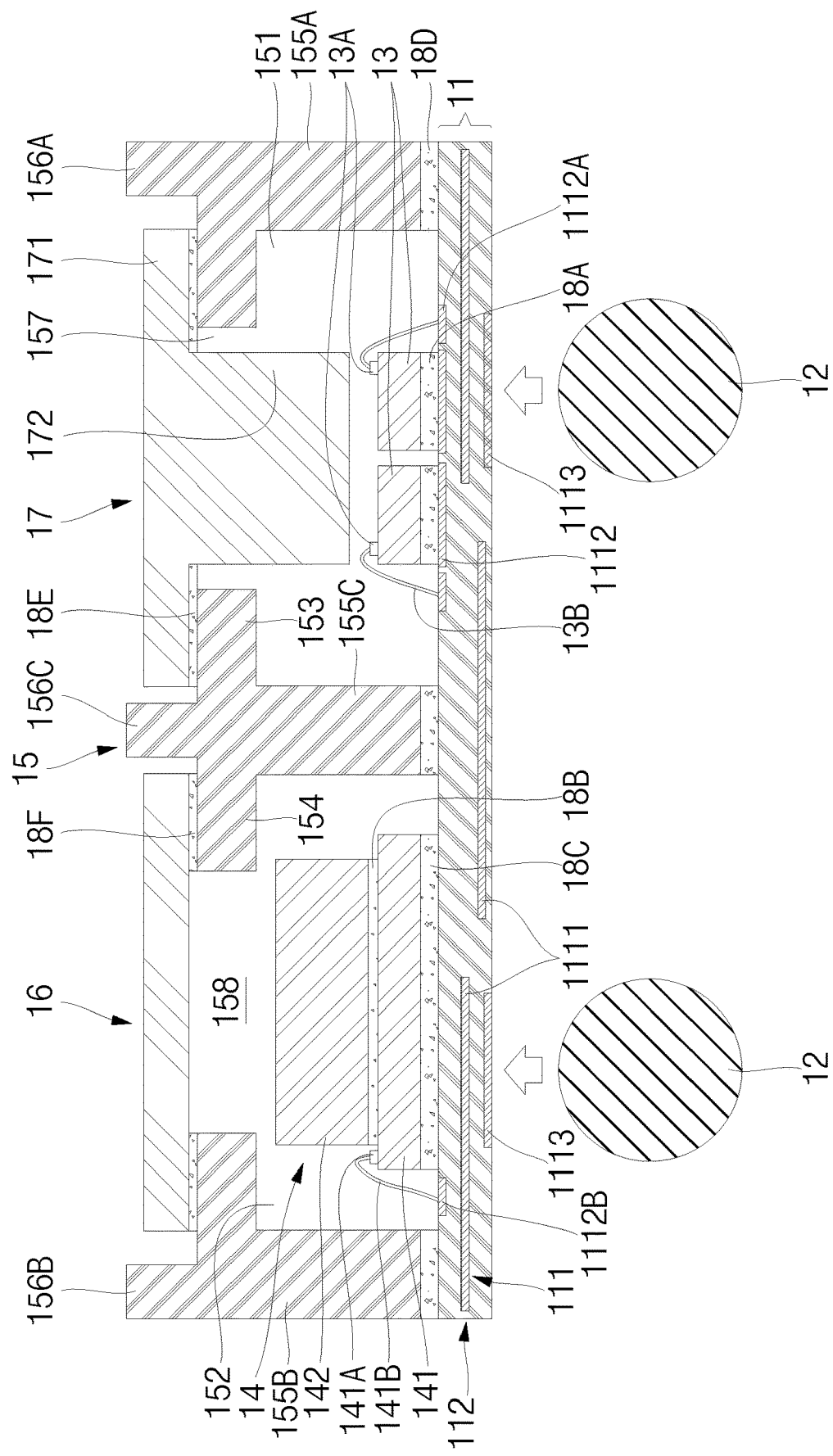

FIG. 2G shows a cross-sectional view of semiconductor device 10 at a later stage of manufacture. In the example shown in FIG. 2G, external interconnects 12 can be coupled to substrate 11. In some examples, external interconnects 12 can be coupled to base interconnects 1113 of substrate 11. In some examples, external interconnects 12 can be referred to as or can comprise pads, lands, bumps, solder balls, copper balls coated solder, pillars, or posts. In some examples, external interconnects 12 can comprise Sn, Ag, Pb, Cu, Sn—Pb, Sn37-Pb, Sn95-Pb, Sn—Pb—Ag, Sn—Cu, Sn—Ag, Sn—Au, Sn—Bi, or Sn—Ag—Cu. External interconnects 12 can have a diameter in the range from approximately 0.05 mm to approximately 0.15 mm. Such external interconnects 12 can electrically connect semiconductor device 10 to an external device. In some examples, external interconnects 12 can be omitted or substituted. For example, external interconnects 12 can comprise flexible printed circuit board (PCB) connectors extending from substrate 11 or coupled to substrate 11.

In some examples, multiple semiconductor devices 10 can be produced on a larger substrate comprising several substrates 11. In some examples, the above-described semiconductor device 10 can be manufactured in a matrix having rows and columns in one wide substrate. In some examples, individual semiconductor devices 10 can be singulated from such larger substrate by a blade or laser beam. The sawing or singulation process of each semiconductor device 10 can make lateral sides of substrate 11 coplanar with lateral sides of cover structure 15.

In the manufacturing method according to the present disclosure, since translucent cover 17 having cover base 171 and cover pipe 172 integrally formed can be employed, for example as a single, unitary, or monolithic piece, semiconductor device 10 having a reduced number of manufacturing process steps can be provided. For example, in the manufacture of semiconductor device 10, a stage of inverting a cover structure, a stage of dispensing adhesives multiple times, or a stage of adhering a pipe to a base, can be omitted.

Figure 3A:
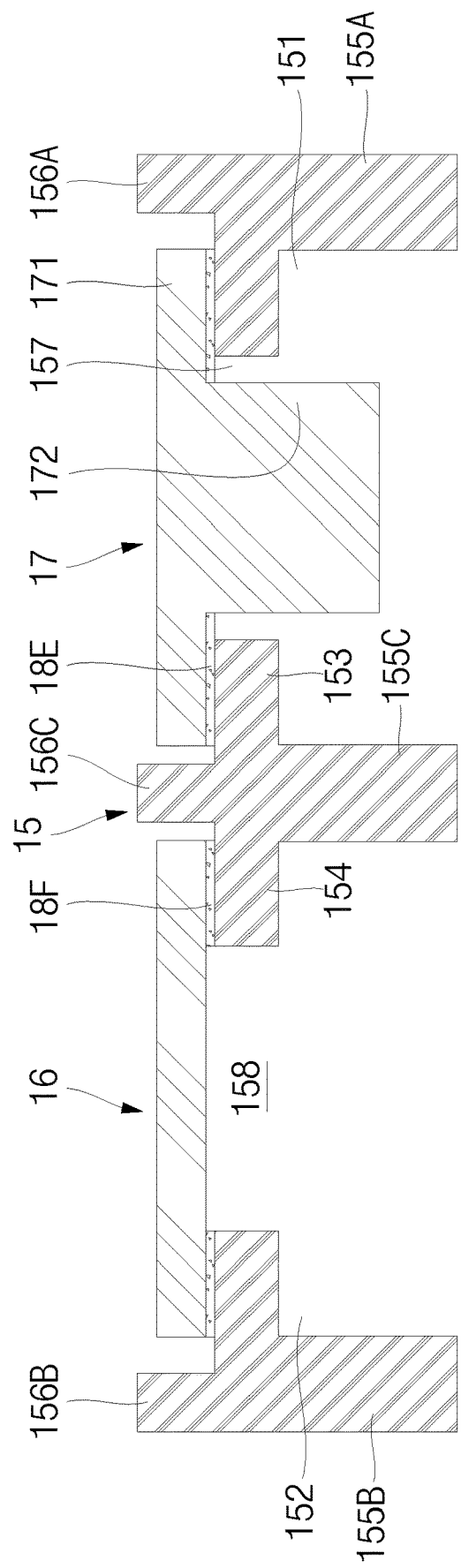
FIGS. 3A to 3B show cross-sectional views of an example method for manufacturing an example semiconductor device.
Figure 3B:
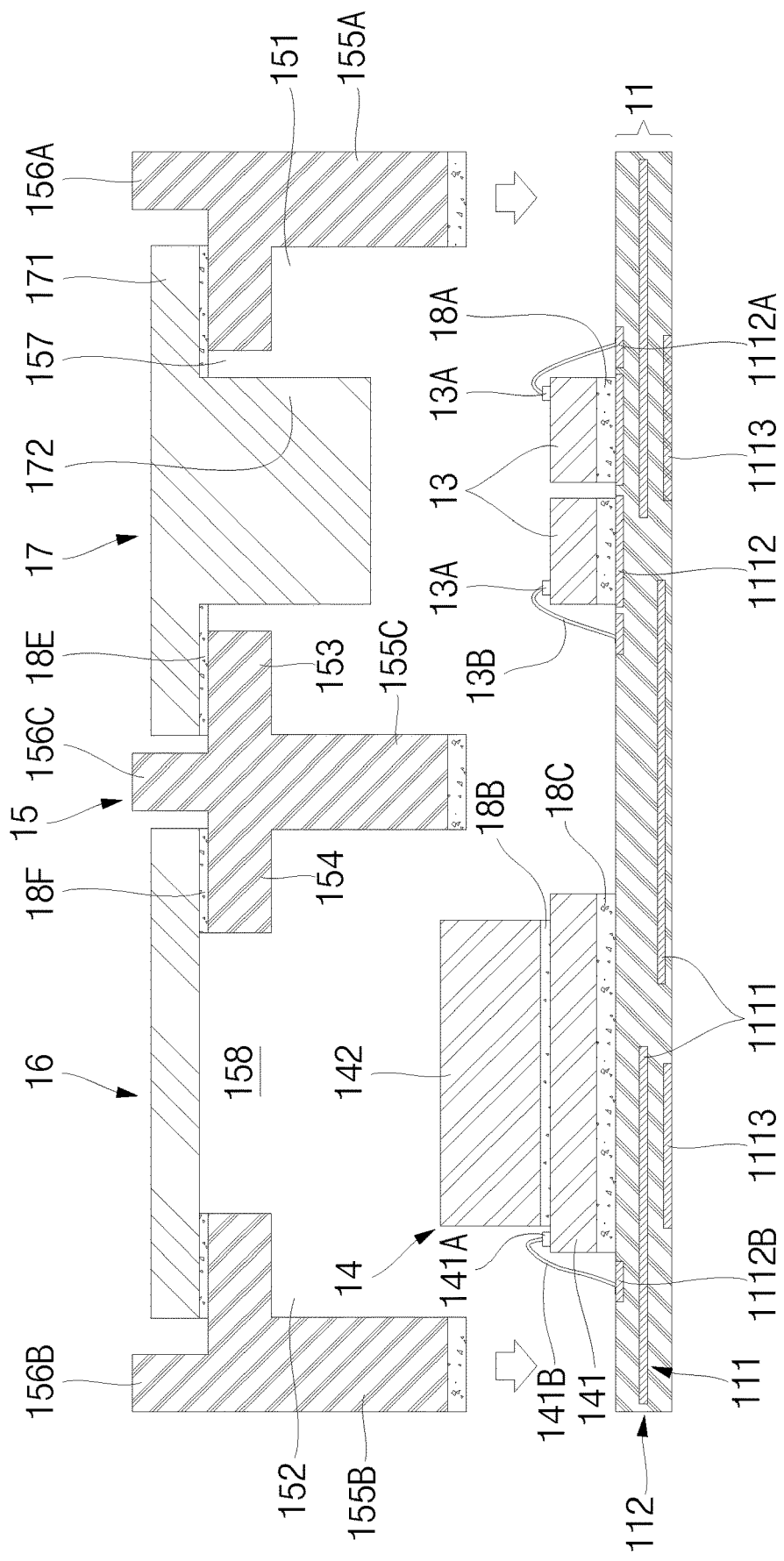

FIG. 3A and FIG. 3B show cross-sectional views of an example method for manufacturing an example semiconductor device. The example method shown in FIGS. 3A and 3B is substantially the same as the example method shown in FIG. 2E and FIG. 2F, except that translucent covers 16 and 17 are provided in a state in which they are combined with cover structure 15 in advance.

FIG. 3A shows a cross-sectional view of semiconductor device 10 at a later stage of manufacture. In the example shown in FIG. 3A, translucent covers 16 and 17 can be provided in a state in which they are pre-combined with cover structure 15. In some examples, translucent cover 17 incorporating cover base 171 and cover pipe 172 can cover opening 157 of compartment 151, and translucent cover 16 can cover opening 158 of compartment 152. In some examples, cover base 171 of translucent cover 17 can be adhered to top side of ledge 153 through adhesive 18E, thereby closing opening 157 of ledge 153, and cover pipe 172 can pass through opening 157 to extend to interior portion of compartment 151. In some examples, translucent cover 16 can be adhered to top side of ledge 154 through adhesive 18F, thereby closing opening 158.

FIG. 3B shows a cross-sectional view of semiconductor device 10 at a later stage of manufacture. In the example shown in FIG. 3B, a method to manufacture semiconductor device 10 can include providing cover structure 15 coupled to translucent covers 16 and 17 to be attached to substrate 11 through adhesive 18D. In some examples, supports 155A, 155B and 155C of cover structure 15 can be adhered to substrate 11 in a manner in which adhesive 18D is applied in advance to bottom ends of supports 155A, 155B and 155C; cover structure 15 can be adhered to substrate 11 in a manner in which adhesive 18D is applied to substrate 11; or supports 155A, 155B and 155C of cover structure 15 can be adhered to substrate 11 in a manner in which adhesive 18D is applied to supports 155A, 155B, or 155C, or substrate 11, respectively. Optical devices 13 and 14 can be coupled to substrate 11 in advance.

Figure 4B:
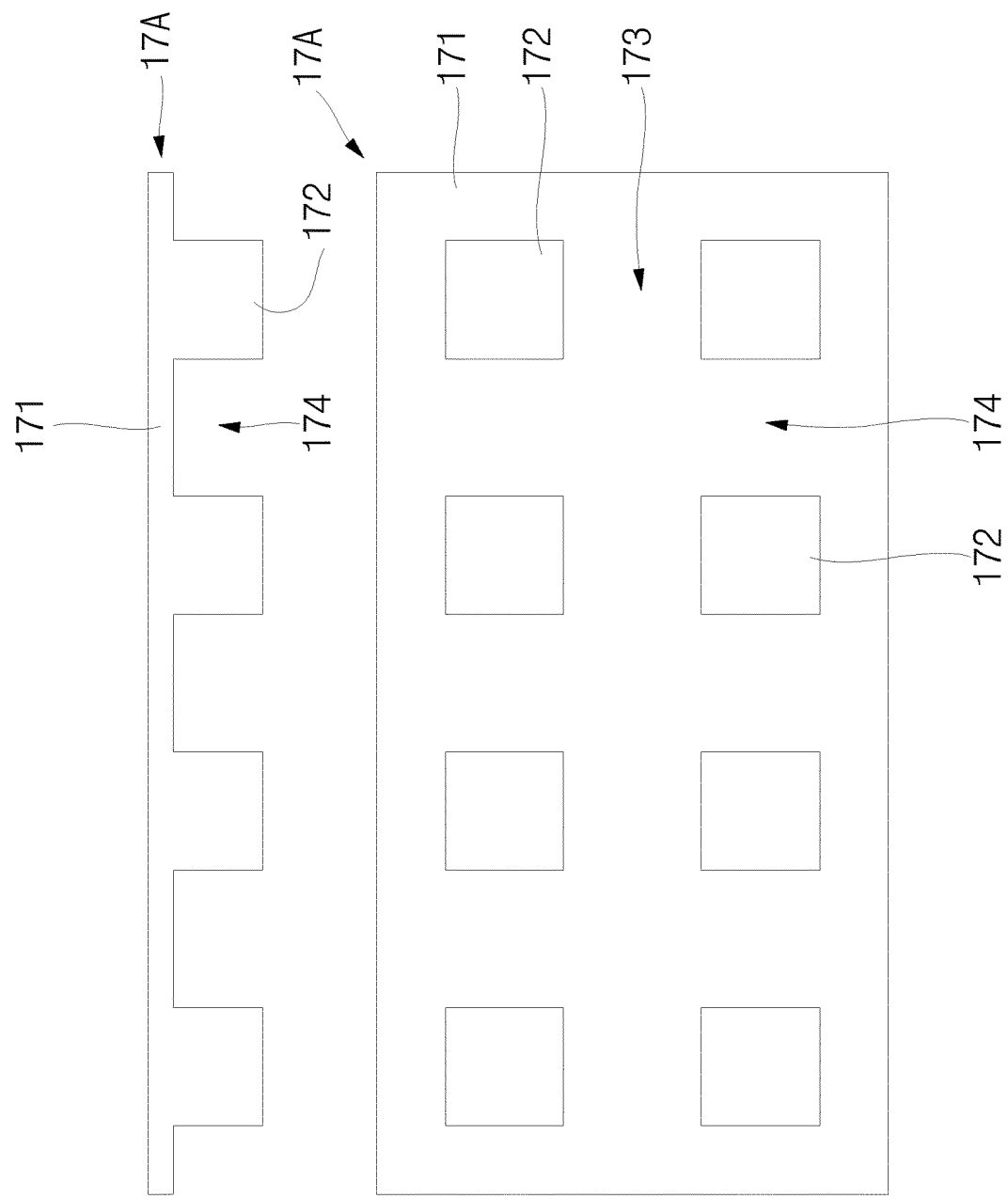

FIG. 4A to FIG. 4D show cross-sectional views and plan views of an example method for manufacturing a translucent cover for an example semiconductor device. FIG. 4A shows a cross-sectional view and plan view of an example method for manufacturing a translucent cover at an early stage of manufacture.

In the example shown in FIG. 4A, a method to manufacture a translucent cover an include providing translucent cover plate 17A having substantially planar top and bottom sides can be provided. Translucent cover plate 17A can be referred to as, or can comprise, silicate glass, borosilicate glass, phosphate glass, sapphire glass, or tempered glass.

FIG. 4B shows a cross-sectional view and plan view of an example method for manufacturing a translucent cover at a later stage of manufacture. In the example shown in FIG. 4B, translucent cover plate 17A can be partially cut, grinded, etched, or bladed to define cover base 171 and cover pipe 172. In some examples, horizontal trenches 173 and vertical trenches 174 can be provided in translucent cover plate 17A to define cover pipes 172. Portions of the regions corresponding to horizontal trenches 173 and vertical trenches 174 can define cover bases 171. The island left between each of horizontal trenches 173 and vertical trenches 174 can be cover pipes 172.

Figure 4C:
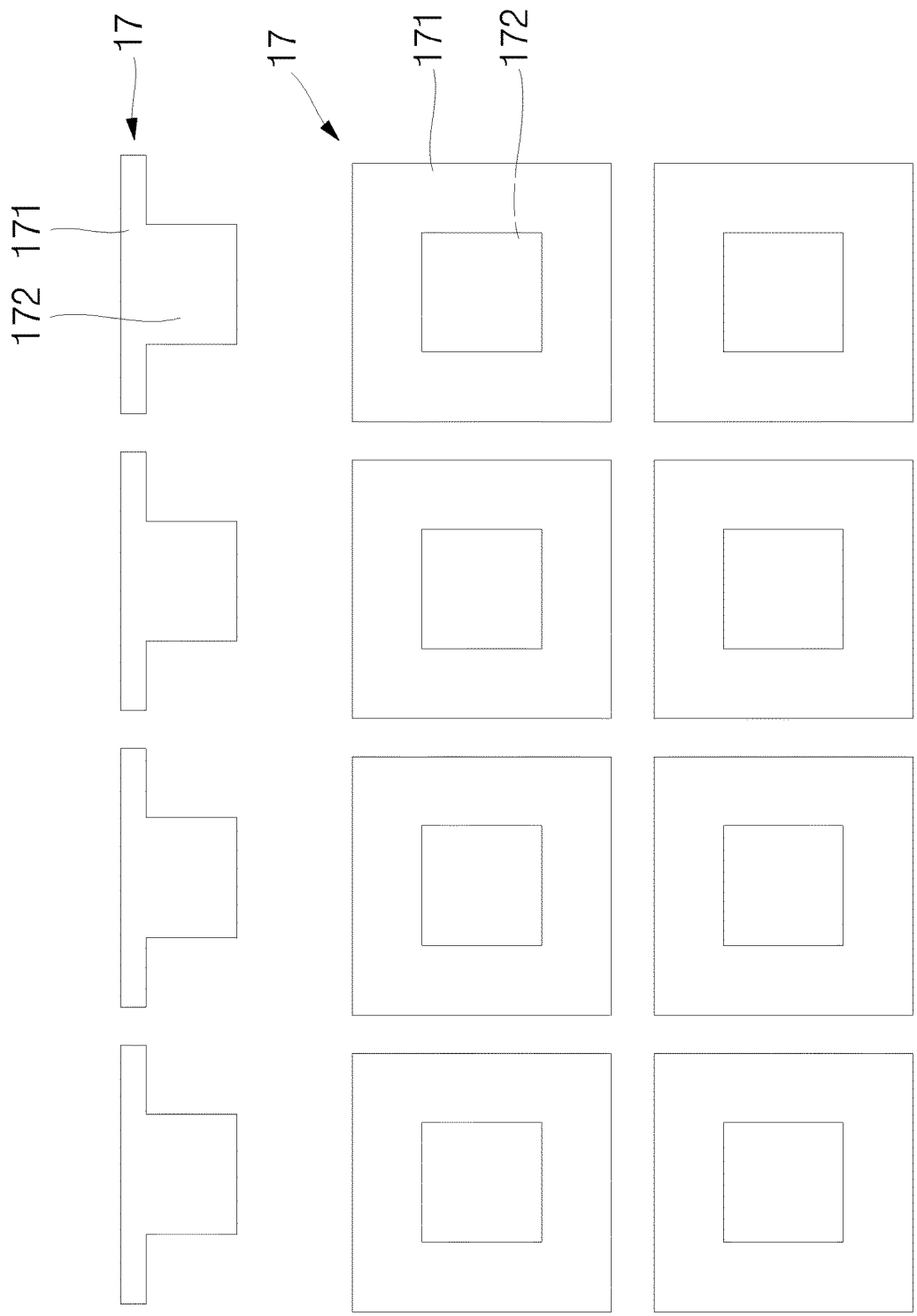

FIG. 4C shows a cross-sectional view and plan view of an example method for manufacturing a translucent cover at a later stage of manufacture. In the example shown in FIG. 4C, translucent cover plate 17A can be singulated, thereby providing individual translucent covers 17. In some examples, sawing tool can fully saw cover base 171 along center lines of horizontally formed trenches and centers of vertically formed trenches, thereby providing individual translucent covers 17 comprising cover base 171 and cover pipe 172. As described above, integrated translucent cover 17 comprising cover base 171 and cover pipe 172 can be provided to the above-described method of manufacturing semiconductor device 10.

FIG. 5 shows a cross-sectional view of an example translucent cover for an example semiconductor device. In the example shown in FIG. 5, translucent cover 17 can comprise polished layer 175. In some examples, at a stage of forming translucent cover 17, polished layer 175 can be formed on lateral side of cover pipe 172. In some examples, polished layer 175 can also be formed on bottom side of cover base 171.

As described above, when translucent cover 17 is formed, lateral side of cover pipe 172 and bottom side of cover base 171 can have greater roughness than top or bottom sides of translucent cover 17. Accordingly, reflection interference can occur due to such roughness. Polished layer 175 can be formed by polishing lateral side of cover pipe 172 and bottom side of cover base 171 using polishing tool, lateral side of cover pipe 172 and bottom side of cover base 171 can have roughness similar to top and bottom sides of translucent cover 17.

In some examples, functional layer 176 can be further formed on translucent cover 17. In some examples, functional layer 176 can comprise a layer that can readily permit passage of ultraviolet (UV) or infrared (IR) light, a layer that can restrict passage of UV or IR light, an anti-static layer, an anti-reflective layer, or a strength reinforcement layer. In some examples, functional layer 176 can be formed by coating or depositing TiO2, ZrO2, or Al2O3 powder on top side or bottom side of translucent cover plate 17. In some examples functional layer 176 can be formed on one or more of top side of cover base 171, lateral side of cover base 171, bottom side of cover base 171, lateral side of cover pipe 172, or bottom side of cover pipe 172.

The present disclosure includes reference to certain examples. It will be understood by those skilled in the art that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. A semiconductor device, comprising:
   a substrate;
   an optical device on a top side of the substrate;
   a translucent cover over the optical device, wherein the translucent cover is a monolithic piece comprising a cover base and a cover pipe, and wherein the cover pipe is over the optical device and between the optical device and the cover base; and
   a cover structure on the top side of the substrate to support the translucent cover over the optical device.

2. The semiconductor device of claim 1, wherein the translucent cover is attached to the cover structure via an adhesive.

3. The semiconductor device of claim 1, wherein the cover structure has a ledge defining an aperture, the cover base is attached to the ledge, and the cover pipe extends towards the optical device through the aperture.

4. The semiconductor device of claim 3, wherein a portion of the cover base is exposed through the aperture.

5. The semiconductor device of claim 1, wherein
   the cover structure comprises a first support portion, a second support portion, a third support portion, a compartment defined between the second and third support portions, and an additional compartment defined between the second and first support portions,
   the optical device is bounded by the compartment, and
   an additional optical device on the top side of the substrate is bounded by the additional compartment.

6. The semiconductor device of claim 5, wherein
   a top of the additional optical device comprises a lens structure, and
   an additional translucent cover covers the additional compartment over the additional optical device.

7. The semiconductor device of claim 6, wherein the optical device is configured to transmit a signal through the translucent cover, and the additional optical device is configured to process the signal received through the additional translucent cover.

8. The semiconductor device of claim 6, wherein the second support portion comprises a protrusion between and extending higher than top sides of the translucent cover and the additional translucent cover.

9. The semiconductor device of claim 5, wherein
the additional optical device comprises a lens structure over an electronic device;
the top side of the electronic device comprises a device terminal uncovered by the lens structure; and
an internal interconnect couples the device terminal to a top side of the substrate.

10. The semiconductor device of claim 6, wherein the lens structure comprises a microlens array (MLA).

11. The semiconductor device of claim 5, wherein the cover pipe extends through a majority of a height of the compartment towards the optical device.

12. The semiconductor device of claim 1, wherein the translucent cover comprises a polished surface on a lateral side of the cover pipe and a bottom side of the cover base.

13. The semiconductor device of claim 1, wherein the translucent cover comprises an optically functional surface on a lateral side of the cover pipe and a bottom side of the cover base.

14. The semiconductor device of claim 1, wherein the optical device comprises a plurality of optical devices.

15. The semiconductor device of claim 1, wherein a portion of the translucent cover has a rectangular shape.

16. The semiconductor device of claim 1, wherein a height of the cover pipe is at least twice a height of the cover base.

17. A method to manufacture a semiconductor device, comprising:
providing a substrate;
providing an optical device on a top side of the substrate;
providing a translucent cover attached to a cover structure, wherein the translucent cover is a monolithic piece comprising a cover base and a cover pipe, and wherein the cover pipe is over the optical device and between the optical device and the cover base; and
attaching the cover structure to the top side of the substrate to cover the optical device with the translucent cover.

18. The method of claim 17, further comprising attaching an additional optical device on the top side of the substrate, wherein a top of the additional optical device comprises a lens structure.

19. A method to manufacture a translucent cover, comprising:
providing a translucent cover plate;
providing trenches in the translucent cover plate to provide an island defining a cover pipe; and
cutting along center lines of the trenches to define a cover base connected to the cover pipe as a monolithic piece.

20. The method of claim 19, wherein the trenches comprise a vertical trench and a horizontal trench.

* * * * *